United States Patent
Powell et al.

(10) Patent No.: US 6,297,464 B1
(45) Date of Patent: Oct. 2, 2001

(54) MICRODEVICE PROGRAMMER/FEEDER REJECT HANDLING SYSTEM

(75) Inventors: Bryan D. Powell, Maple Valley; Richard Alan Bernard, Everett; Lev M. Bolotin, Kirkland; Bradley Morris Johnson, Edmonds, all of WA (US)

(73) Assignee: Data I/O Corporation, Redmond, WA (US)

( * ) Notice: Subject to any disclaimer, the term of this patent is extended or adjusted under 35 U.S.C. 154(b) by 0 days.

(21) Appl. No.: 09/484,186

(22) Filed: Jan. 18, 2000

(51) Int. Cl.[7] .................................................. B07C 5/344
(52) U.S. Cl. ........................ 209/573; 209/571; 209/933
(58) Field of Search ................................... 209/651, 933, 209/552, 3.2, 630, 571, 573

(56) References Cited

U.S. PATENT DOCUMENTS

| | | | | |
|---|---|---|---|---|
| 3,770,123 | * | 11/1973 | Mraz ..................... | 209/107 |
| 3,910,416 | * | 10/1975 | Payne ..................... | 209/74 |
| 4,747,479 | * | 5/1988 | Herrman ............... | 198/345 |
| 5,695,071 | * | 12/1997 | Ross et al. ............ | 209/616 |
| 6,111,211 | * | 8/2000 | Dziedzic et al. .... | 200/61.2 |

FOREIGN PATENT DOCUMENTS

| | | | |
|---|---|---|---|
| 196 12 7813 A | 10/1997 | (DE) | G01R/31/26 |
| 0 517 439 A | 12/1992 | (EP) | H05K/13/02 |

* cited by examiner

Primary Examiner—Donald P. Walsh
Assistant Examiner—Joseph Rodriguez
(74) Attorney, Agent, or Firm—Mikio Ishimaru

(57) ABSTRACT

A microdevice reject handling system is provided for in a microdevice processing/feeder system. The feeder mechanism is immediately adjacent to the processing mechanism for receiving and moving microdevices away from the processing mechanism. It uses a conveyor which has a dead space in which microdevices cannot be placed by a robotic transport system, which moves microdevices from the processing mechanism to the feeder mechanism. The microdevice reject handling system is partially positioned in the feeder mechanism dead space for receiving rejected microdevices. It includes a reject bin with a storage portion for storing rejected microdevices beside the feeder mechanism and rests on a bracket containing an optical sensor system for determining when the storage portion is full.

20 Claims, 3 Drawing Sheets

MICRODEVICE PROGRAMMER/FEEDER REJECT HANDLING SYSTEM

CROSS REFERENCE TO RELATED APPLICATION

The present application contains subject matter related to a co-pending U.S. Patent Application by Lev M. Bolotin entitled "MANUFACTURING SYSTEM WITH FEEDER/PROGRAMMING/BUFFER SYSTEM". The related application is assigned to Data I/O Corporation, is identified by Ser. No. 09/418,732, and is hereby incorporated by reference.

TECHNICAL FIELD

The present invention relates generally to handling rejected microdevices for assembly lines and more particularly to handling rejected microdevices in a programmer/feeder.

BACKGROUND ART

In the past, programmable microdevices were programmed in a large, standalone programming system, which had a programmer handling system. The programmer handling system would pick up unprogrammed microdevices, place them in the programmers for programming, and remove them for placement on a carrier. The programmer handling systems would also place rejected microdevices, which did not meet specifications or which could not be programmed, into large reject bins appropriate to large programming systems. The programmed microdevices, which were not rejected, would be placed on the carrier and placed in an input feeder, which would be attached to an assembly line. The assembly line had its own assembly line handling system which would pick up the programmed microdevices and place them on printed circuit boards.

With the advent of the programmer/feeder where programming and feeding are performed in a single device, space is at a premium. Since a programmer/feeder must be placed on the assembly line in a space which was formerly only occupied by a feeder, it has become extremely difficult to find space for a reject handling system.

The old concept of the standalone programming system or the newer concept of using the assembly line handling system for placing rejected parts into a separate reject bin has been found to be extremely time-consuming and inefficient, because of the long movements required, however, heretofore there has been no other solution.

Ideally, a microdevice reject handling system would take up as little space as possible, require short reject movements, and allow easy removal of rejected parts. This ideal has been extremely difficult to achieve and has eluded those skilled in the art.

DISCLOSURE OF THE INVENTION

The present invention provides a microdevice reject handling system in a microdevice processing/feeder system. A robotic transport mechanism moves microdevices from the processing mechanism to the immediately adjacent feeder mechanism. The feeder mechanism has a dead space in which microdevices cannot be placed by the robotic transport system. The microdevice reject handling system is partially positioned in the feeder mechanism dead space for receiving rejected microdevices from the robotic transport mechanism and storing them beside the feeder mechanism. It includes a reject bin with a storage portion for storing rejected microdevices beside the feeder mechanism and rests on a bracket containing an optical sensor system for determining when the storage portion is full. This configuration allows for a microdevice reject handling system which is compact both in the lateral and depth-wise direction of the processing/feeder, requires short reject movements, and allows easy removal of rejected microdevices.

The present invention further provides a programmable microdevice reject handling system in a microdevice programmer/feeder system. A robotic transport mechanism moves microdevices from the programming mechanism to the immediately adjacent conveyor feeder mechanism. The conveyor feeder mechanism has a dead space in which microdevices cannot be placed by the robotic transport system. The microdevice reject handling system is partially positioned in the conveyor feeder mechanism dead space for receiving rejected microdevices from the robotic transport mechanism and storing them beside the conveyor feeder mechanism. It includes a reject bin with a storage portion for storing rejected microdevices beside the conveyor feeder mechanism and rests on a bracket containing an optical sensor system for determining when the storage portion is full. This configuration allows for a microdevice reject handling system which is compact both in the lateral and depth-wise direction of the programmer/feeder, requires short reject movements, and allows easy removal of rejected microdevices.

The above and additional advantages of the present invention will become apparent to those skilled in the art from a reading of the following detailed description when taken in conjunction with the accompanying drawings.

BEST MODE FOR CARRYING OUT THE INVENTION

Structure

Figure 1:
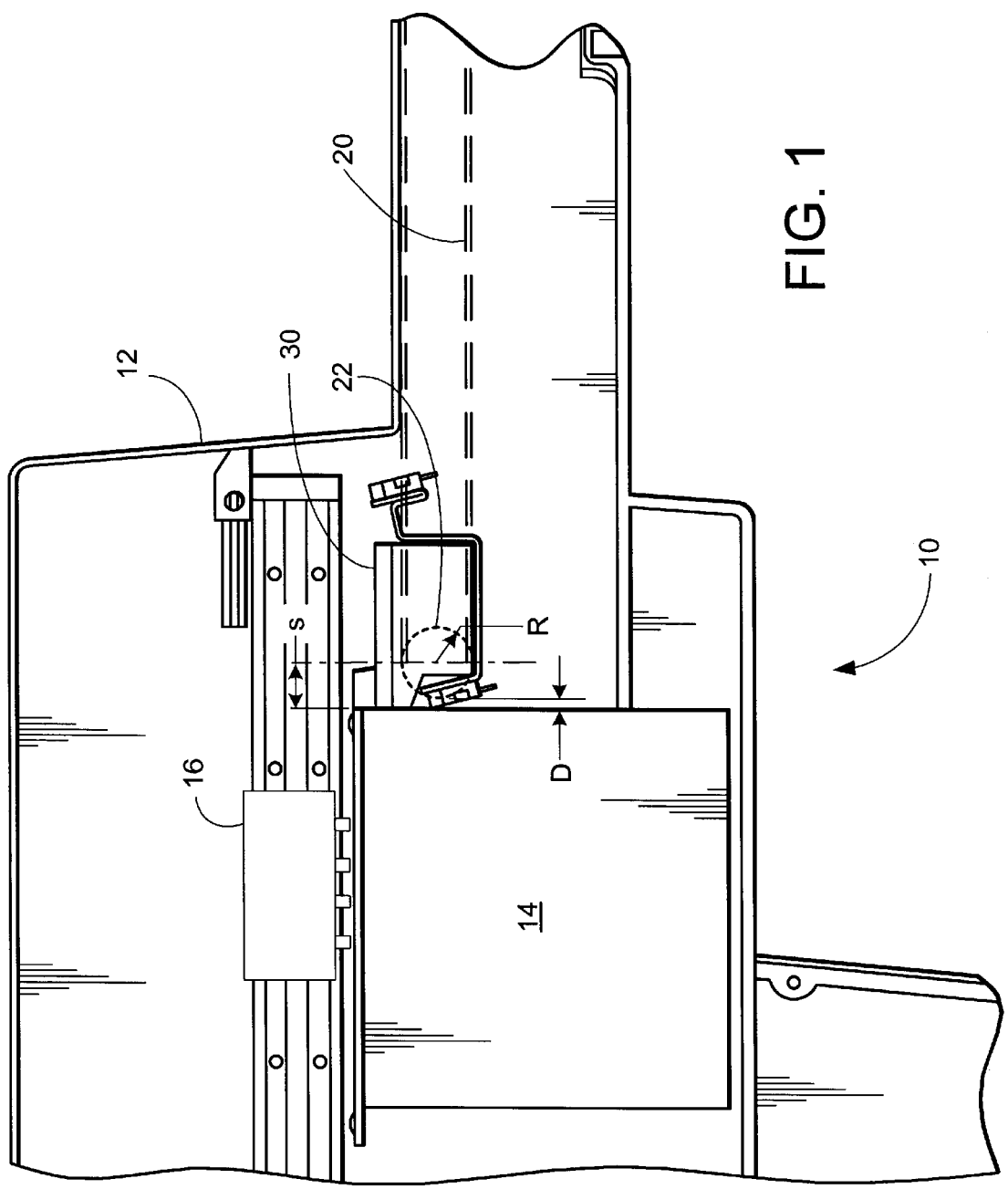
FIG. 1 is a cutaway cross-sectional view of the programmer/feeder incorporating the present invention.

Referring now to FIG. 1, therein is shown a cutaway side view of a processing system, such as a programmer/feeder 10 incorporating the present invention. The programmer/feeder 10 includes a frame 12 containing a processing unit, or programmer 14, and a robotic transport system 16 for transferring microdevices 18 from the programmer 14 to a feeder mechanism, such as a conveyor belt 20.

The conveyor belt 20 has a pair of rollers, of which only one roller 22 is shown. The roller 22 has a radius R and is spaced a distance D from the programmer 14. For ease of understanding, the conveyor belt 20 and the roller 22 are shown in dotted outline. A space S represents a "dead space", which is the sum of the distance D plus the radius R, and is a space in which the robotic transport system 16 can not place microdevices 18.

Positioned behind the conveyor belt 20 and the roller 22 is a microdevice reject handling system 30 of the present invention.

Figure 2:
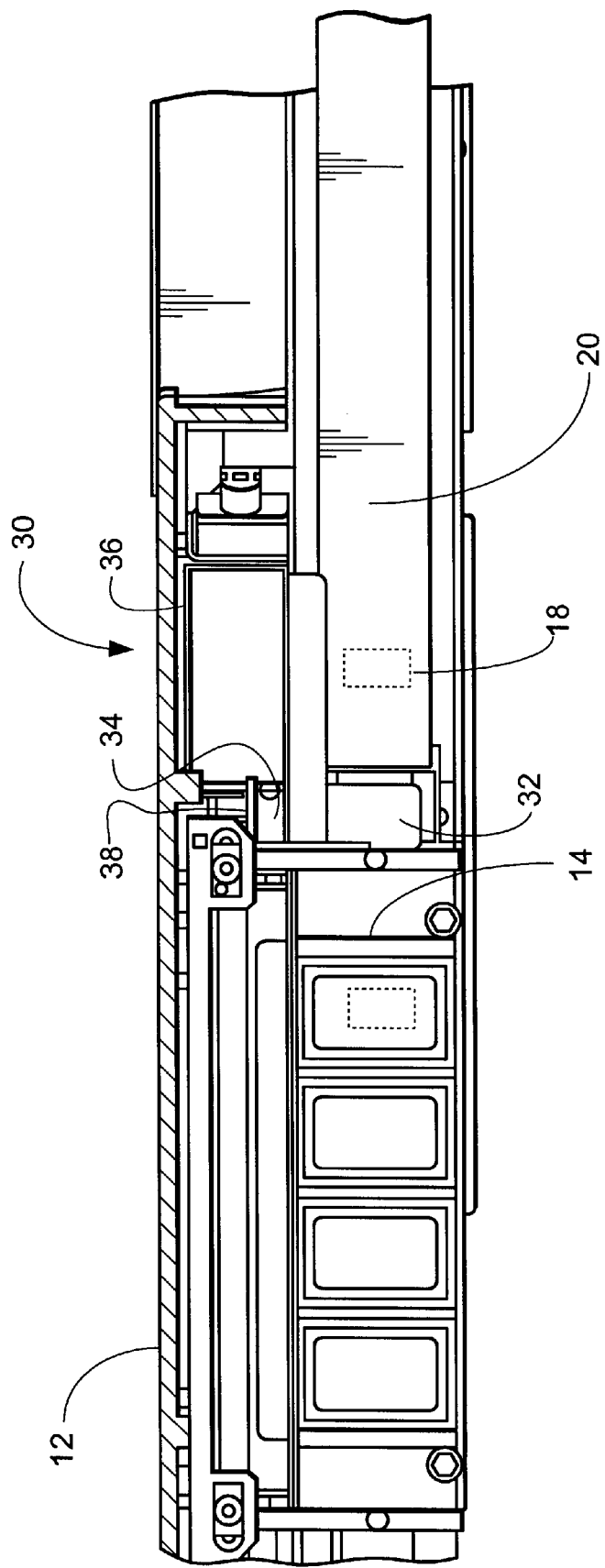
FIG. 2 is a plan view of the programmer/feeder incorporating the present invention.

Referring now to FIG. 2, therein is shown a cutaway plan view of the programmer/feeder 10. The programmer 14 and the conveyor belt 20 are shown to be collinear in this view and the robotic transport system 16 is shown over the programmer 14 and also to the back.

The microdevice reject handling system 30, in part, is shown to have a first sloped portion 32, which is disposed in the dead space S, and a second sloped portion 34, which leads to a storage portion 36. The second sloped portion 34 and the storage portion 36 are both behind the conveyor belt 20.

Figure 3:
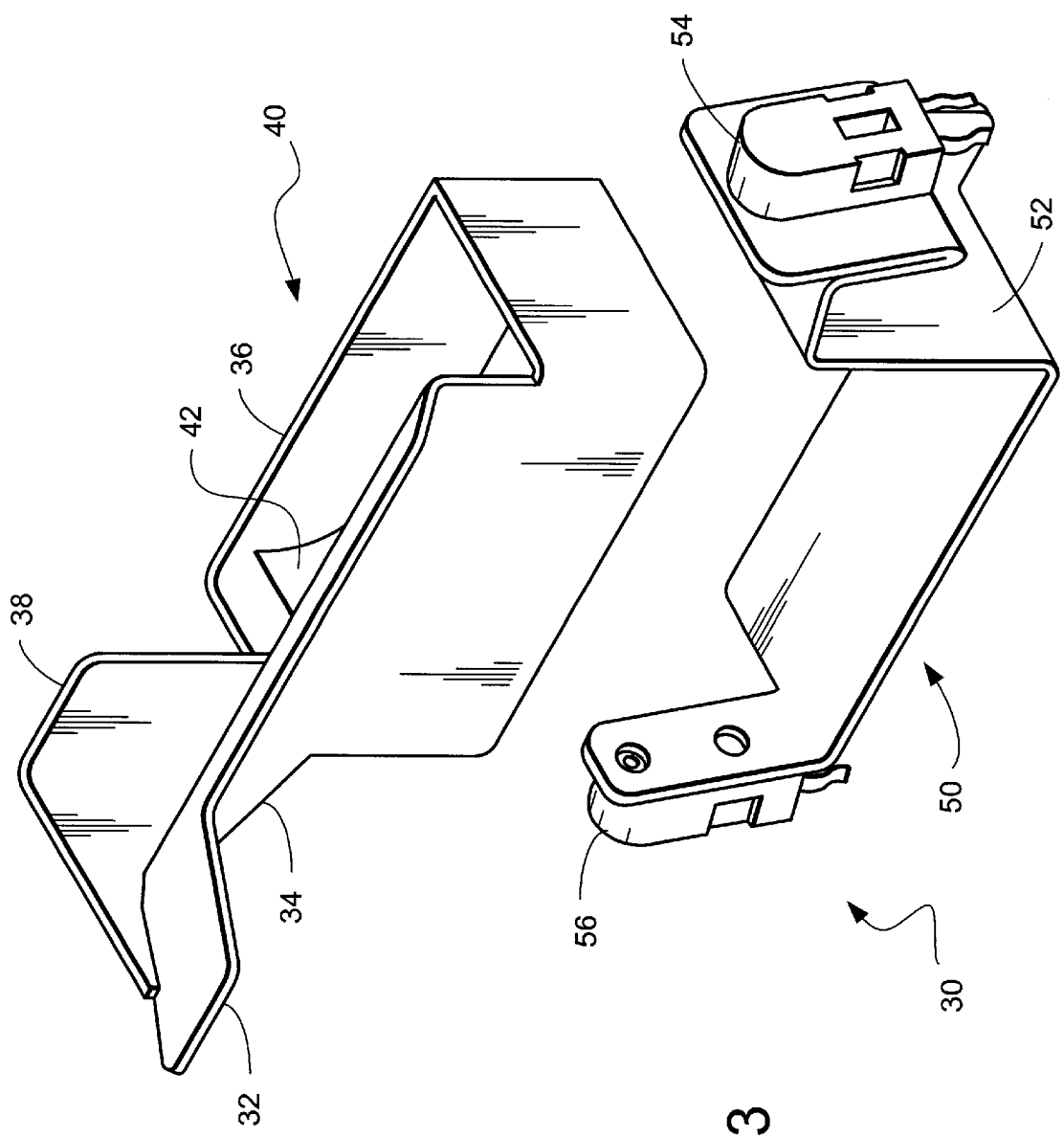
FIG. 3 is an isometric view of the microdevice reject handling system of the present invention.

Referring now to FIG. 3, therein is shown an isometric view of a portion of the microdevice reject handling system 30. This portion includes a reject bin 40, which has the first sloped portion 32 sloping towards the second sloped portion 34, which is partially surrounded by a backstop portion 38. This allows the direction of microdevices 18 which have been put on the first sloped portion 32 to slide into the storage portion 36. The storage portion 36 also contains an arced slide 42, which prevents accumulation of microdevices 18 just under the end of the second sloped portion 34 but allows them to spread along the length of the storage portion 36.

The microdevice reject handling system 30 further includes a support system 50. The support system 50 includes a bracket 52 which is formed to accommodate send and receive optical sensor units 54 and 56 which are parts on an overflow sensor system 58. As would be evident, the reject bin 40 fits into the bracket 52 so the overflow sensor system 58 can sense microdevices which accumulate above the walls of the storage portion 36.

Operation

In operation, the robotic transport system 16 deposits the microdevices 18 into the programmer 14 and removes them for placement on the conveyor belt 20. In order to minimize movement of the robotic transport system 16, the dead space S is made as small as possible as indicated in FIGS. 1 and 2.

Because of the use of the conveyor belt 20, there is a dead zone equal to the distance D plus the radius R of the roller 22 in which a microdevice 18 cannot be placed without falling off of the conveyor belt 20. The first sloped portion 32 of the reject bin 40 is designed to have a width less than the dead space S so as to be smaller than the distance D plus the radius R.

Thus, it is possible for the robotic transport system 16 to take a rejected microdevice 18 and release it onto the first sloped portion 32 of the reject bin 40 of FIG. 2. The deposited rejected microdevice 18 would slide back down the first sloped portion 32 where the backward motion would be stopped by the backstop portion 38. Because of the second sloped portion 34, the microdevice 18 would be directed into the storage portion 36 of the reject bin 40.

The second sloped portion 34 is required so that there will be room for the overflow sensor system 58 between the programmer 14 and the bracket 52 of the reject handling system 30. The send and receive optical sensors units 54 and 56 are conventional sensors which indicate when the storage portion 36 is filled with rejected microdevices 18 so the operator will know to remove and empty the reject bin 40.

One feature of the present invention is that the first sloped portion 32 may be used as a handle to lift the reject bin 40 over the top of the conveyor belt 20 for emptying. It is desirable for the reject handling system 30 to be behind the conveyor belt 20 so as to make the front-to-back depth of the programmer/feeder 10 as small as possible.

From the above it will be understood that the present invention is applicable to what can be described as "microdevices". Microdevices include a broad range of electronic and mechanical devices. The best mode describes processing which is programming for programmable devices, which include but are not limited to devices such as Flash memories (Flash), electrically erasable programmable read only memories ($E^2PROM$), programmable logic devices (PLDs), field programmable gate arrays (FPGAs), and microcontrollers. However, the present invention encompasses processing for all electronic, mechanical, hybrid, and other devices which require testing, measurement of device characteristics, calibration, and other processing operations. For example, these types of microdevices would include but not be limited to devices such as microprocessors, integrated circuits (ICs), application specific integrated circuits (ASICs), micro mechanical machines, micro-electromechanical (MEMs) devices, micro modules, and fluidic systems.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A microdevice processing/feeder system comprising:
    a processing mechanism for processing microdevices;
    a feeder mechanism adjacent to the processing mechanism for receiving and moving microdevices away from the processing mechanism, the feeder mechanism having a dead space provided thereon in which microdevices cannot be placed;
    a robotic transport system for moving microdevices from the processing mechanism and placing microdevices on the feeder mechanism;
    a microdevice reject system disposed in the feeder mechanism dead space for receiving rejected microdevices, the microdevice reject system including a reject bin configured to receive rejected microdevices from the robotic transport system in the feeder mechanism dead space, the reject bin including a storage portion for storing rejected microdevices beside the feeder mechanism.

2. The microdevice processing/feeder system as claimed in claim 1 including a sensor system disposed proximate the storage portion of the reject bin for providing an indication when the storage bin is filled with microdevices.

3. The microdevice processing/feeder system as claimed in claim 2 wherein:
    the microdevice reject system includes a bracket for supporting the reject bin; and
    the bracket has the sensor system mounted thereon.

4. The microdevice processing/feeder system as claimed in claim 3 wherein the reject bin has a first sloped portion for moving rejected microdevices from the feeder mechanism dead space, and a second sloped portion for moving rejected microdevices perpendicularly from the first sloped portion to the storage portion.

5. The microdevice processing/feeder system as claimed in claim 4 wherein the reject bin is configured to allow removal thereof from the bracket and the sensor system.

6. A microdevice processing/feeder system comprising:
    a processing mechanism for processing microdevices;
    a conveyor belt feeder mechanism adjacent to the processing mechanism for receiving and moving microdevices away from the processing mechanism, the feeder mechanism having a roller drive and a dead space in which microdevices cannot be placed on the conveyor belt resulting from the radius of the roller drive; p1 a robotic transport system for moving microdevices from the processing mechanism and placing microdevices on the feeder mechanism;

a microdevice reject system disposed in the feeder mechanism dead space for receiving rejected microdevices, the microdevice reject system including a reject bin configured to receive rejected microdevices from the robotic transport system in the feeder mechanism dead space, the reject bin including a storage portion for storing rejected microdevices beside the feeder mechanism.

7. The microdevice processing/feeder system as claimed in claim 6 including an optical sensor system disposed proximate the storage portion of the reject bin for providing an indication when the storage bin is filled with microdevices.

8. The microdevice processing/feeder system as claimed in claim 7 wherein:

the microdevice reject system includes a bracket for supporting the reject bin; and the bracket has the optical sensor system mounted thereon.

9. The microdevice processing/feeder system as claimed in claim 8 wherein the reject bin has a storage portion for storing microdevices beside the feeder mechanism, a first sloped portion for moving rejected microdevices from the feeder mechanism dead space, a second sloped portion for moving rejected microdevices perpendicularly from the first sloped portion into the storage portion.

10. The microdevice processing/feeder system as claimed in claim 9 wherein the reject bin is configured to allow removal thereof from the bracket and the optical sensor system.

11. A microdevice reject handling system for a processing/feeder system having a processing mechanism for processing microdevices, a feeder mechanism adjacent to the processing mechanism for receiving and moving microdevices away from the processing mechanism, the feeder mechanism having a dead space thereon in which microdevices cannot be placed, comprising:

a robotic transport system for moving microdevices from the processing mechanism and placing microdevices on the feeder mechanism;

a microdevice reject system disposed in the feeder mechanism dead space for receiving rejected microdevices, the microdevice reject system including a reject bin configured to receive rejected microdevices from the robotic transport system in the feeder mechanism dead space, the reject bin including a storage portion for storing rejected microdevices beside the feeder mechanism.

12. The microdevice reject handling system as claimed in claim 11 including a sensor system disposed proximate the storage portion of the reject bin for providing an indication when the storage bin is filled with microdevices.

13. The microdevice reject handling system as claimed in claim 12 wherein:

the microdevice reject system includes a bracket for supporting the reject bin; and the bracket has the sensor system mounted thereon.

14. The microdevice reject handling system as claimed in claim 13 wherein the reject bin has a first sloped portion for moving rejected microdevices from the feeder mechanism dead space, and a second sloped portion for moving rejected microdevices perpendicularly from the first sloped portion to the storage portion.

15. The microdevice reject handling system as claimed in claim 14 wherein the reject bin is configured to allow removal thereof from the bracket and the sensor system.

16. A microdevice reject handling system for microdevice processing/feeder system having a processing mechanism for processing microdevices, a conveyor belt feeder mechanism adjacent to the processing mechanism for receiving and moving microdevices away from the processing mechanism, the feeder mechanism having a roller drive and a dead space in which microdevices cannot be placed on the conveyor belt resulting from the radius of the roller drive, comprising:

a robotic transport system for moving microdevices from the processing mechanism and placing microdevices on the feeder mechanism;

a microdevice reject system disposed in the feeder mechanism dead space for receiving rejected microdevices, the microdevice reject system including a reject bin configured to receive rejected microdevices from the robotic transport system in the feeder mechanism dead space, the reject bin including a storage portion for storing rejected microdevices beside the feeder mechanism.

17. The microdevice reject handling system as claimed in claim 16 including an optical sensor system disposed proximate the storage portion of the reject bin for providing an indication when the storage bin is filled with microdevices.

18. The microdevice reject handling system as claimed in claim 17 wherein:

the microdevice reject system includes a bracket for supporting the reject bin; and the bracket has the optical sensor system mounted thereon.

19. The microdevice reject handling system as claimed in claim 18 wherein the reject bin has a storage portion for storing microdevices beside the feeder mechanism, first sloped portion for moving rejected microdevices from the feeder mechanism dead space, a second sloped portion for moving rejected microdevices perpendicularly from the first sloped portion into the storage portion.

20. The microdevice reject handling system as claimed in claim 19 wherein the reject bin is configured to allow removal thereof from the bracket and the optical sensor system.

* * * * *